US010557195B2

(12) United States Patent
Nagata et al.

(10) Patent No.: US 10,557,195 B2
(45) Date of Patent: Feb. 11, 2020

(54) SPUTTERING TARGET AND/OR COIL, AND PROCESS FOR PRODUCING SAME

(71) Applicant: JX Nippon Mining & Metals Corporation, Tokyo (JP)

(72) Inventors: Kenichi Nagata, Ibaraki (JP); Nobuhito Makino, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 59 days.

(21) Appl. No.: 15/713,834

(22) Filed: Sep. 25, 2017

(65) Prior Publication Data

US 2018/0010241 A1    Jan. 11, 2018

Related U.S. Application Data

(62) Division of application No. 13/809,189, filed as application No. PCT/JP2011/067061 on Jul. 27, 2011, now Pat. No. 9,951,412.

(30) Foreign Application Priority Data

Jul. 30, 2010   (JP) ................................ 2010-172408

(51) Int. Cl.
*C23C 14/34* (2006.01)
*H01J 37/34* (2006.01)
(Continued)

(52) U.S. Cl.
CPC ............... *C23C 14/34* (2013.01); *C21D 1/74* (2013.01); *C21D 3/06* (2013.01); *C22C 14/00* (2013.01);
(Continued)

(58) Field of Classification Search
CPC ........ C34C 14/3414; C34C 14/34–505; C23C 14/3414; C23C 14/34–505
See application file for complete search history.

(56) References Cited

U.S. PATENT DOCUMENTS

| 4,838,935 A | 6/1989 | Dunlop et al. |
| 5,298,338 A * | 3/1994 | Hiraki ................. C23C 14/3414 148/513 |

(Continued)

FOREIGN PATENT DOCUMENTS

| CN | 95109070 A | 6/1987 |
| EP | 0902102 A1 | 3/1999 |

(Continued)

OTHER PUBLICATIONS

Yoshiura et al., machine translation JP H01-149959 A (Year: 1989).*

(Continued)

*Primary Examiner* — Rodney G McDonald
*Assistant Examiner* — Ho-Sung Chung
(74) *Attorney, Agent, or Firm* — Howson & Howson LLP

(57) ABSTRACT

A sputtering target and/or a coil disposed at a periphery of a plasma-generating region for confining plasma are provided. The target and/or coil has a surface to be eroded having a hydrogen content of 500 µL/cm² or less. In dealing with reduction in hydrogen content of the surface of the target and/or coil, a process of producing the target and/or coil, in particular, conditions for heating the surface of the target and/or coil, which is believed to be a cause of hydrogen occlusion, are appropriately regulated. As a result, hydrogen occlusion at the surface of the target can be reduced, and the degree of vacuum during sputtering can be improved. Thus, a target and/or coil is provided that has a uniform and fine structure, makes plasma stable, and allows a film to be formed with excellent uniformity. A method of producing the target and/or the coil is also provided.

5 Claims, 1 Drawing Sheet

(51) Int. Cl.
*C21D 1/74* (2006.01)
*C21D 3/06* (2006.01)
*C22C 14/00* (2006.01)
*C22F 1/00* (2006.01)
*C22F 1/18* (2006.01)
*C22C 27/02* (2006.01)

(52) U.S. Cl.
CPC ............ *C22C 27/02* (2013.01); *C22F 1/00* (2013.01); *C22F 1/18* (2013.01); *C22F 1/183* (2013.01); *C23C 14/3414* (2013.01); *C23C 14/3471* (2013.01); *H01J 37/3426* (2013.01); *H01J 37/3464* (2013.01); *H01J 37/3491* (2013.01); *H01J 37/3497* (2013.01); *Y10T 29/49865* (2015.01)

(56) References Cited

U.S. PATENT DOCUMENTS

| | | | |
|---|---|---|---|
| 5,460,793 | A | 10/1995 | Kano et al. |
| 5,618,397 | A | 4/1997 | Kano et al. |
| 6,001,227 | A | 12/1999 | Pavate et al. |
| 6,042,777 | A | 3/2000 | Lo et al. |
| 6,153,315 | A * | 11/2000 | Yamakoshi ......... C23C 14/3407 204/192.15 |
| 6,315,872 | B1 | 11/2001 | Pavate et al. |
| 6,755,948 | B1 | 6/2004 | Fukuyo et al. |
| 6,974,976 | B2 | 12/2005 | Hollars |
| 7,909,949 | B2 | 3/2011 | Nakamura et al. |
| 2005/0282473 | A1 | 12/2005 | Saito et al. |
| 2006/0260937 | A1 | 11/2006 | Miller et al. |
| 2009/0212434 | A1 | 8/2009 | Anderson et al. |
| 2011/0114481 | A1 | 5/2011 | Satoh et al. |
| 2011/0114999 | A1 | 5/2011 | Yamazaki et al. |

FOREIGN PATENT DOCUMENTS

| | | | |
|---|---|---|---|
| JP | H01-149959 A | * | 6/1989 |
| JP | 01-290766 A | | 11/1989 |
| JP | 03-257158 A | | 11/1991 |
| JP | 07-070744 A | | 3/1995 |
| JP | 08-013141 A | | 1/1996 |
| JP | 11-019853 A | | 1/1999 |
| JP | 2003-226963 A | | 8/2003 |

OTHER PUBLICATIONS

Wille et al., Hydrogen in Titanium Alloys (Year: 1981).*
Gross et al., Recommended Best Practices for the Characterization of Storage Properties of Hydrogen Storage Materials (Year: 2008).*
L. Sheng-Lin et al., "A Glass Apparatus of Molecular Beam for Investigating Gas-Surface Interactions", Vacuum Science and Technology (China), vol. 4, No. 5, pp. 319-323, Sep. 1984.
D. Neuhaus, "Method for Measuring Chemical Diffusion Coefficients in Solids", Applied Physics A, Materials Science & Processing, vol. 100, No. 4, pp. 991-1000, Jul. 2010 (Abstract only).
T. Volburger et al., "The Displacement of Hydrogen by Carbon Monoxide on the (100) Face of Tungsten: A Photoemission and Thermal Desorption Study", Surface Science, vol. 60, No. 1, pp. 211-230, Nov. 1976 (Abstract only).

* cited by examiner

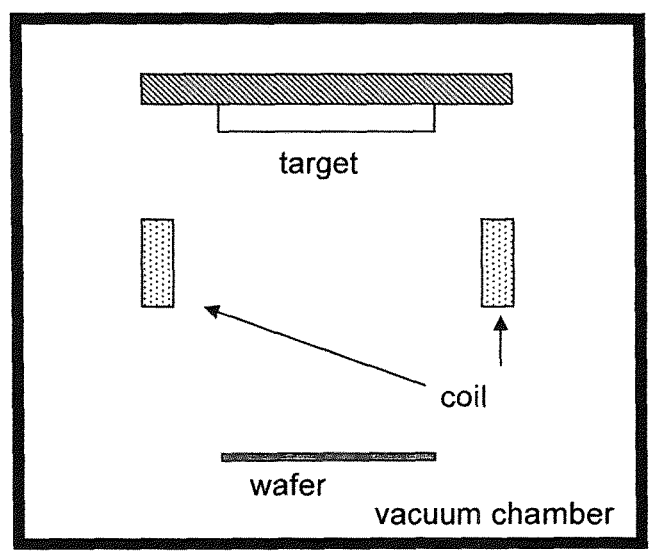

SPUTTERING TARGET AND/OR COIL, AND PROCESS FOR PRODUCING SAME

CROSS REFERENCE TO RELATED APPLICATIONS

This application is a divisional of co-pending U.S. application Ser. No. 13/809,189 which is a 371 National Stage of International Application No. PCT/JP2011/067061, filed Jul. 27, 2011, which claims the benefit under 35 USC 119 of Japanese Application No. 2010-172408, filed Jul. 30, 2010.

BACKGROUND

The present invention relates to a sputtering target and/or a coil that can increase the degree of vacuum during sputtering, have uniform and fine structures, give stable plasma, and allow production of a film having excellent uniformity, and relates to a method of producing such a target or a coil.

Recent years, sputtering is used for forming a coating of, for example, a metal or a ceramic material in various fields such as electronics, corrosion-resistant materials, decorations, catalysts, and production of cutting/abrasive materials and wear-resistant materials. Though sputtering itself is a well-known method, recently, in particular, in the electronics field, sputtering targets suitable for forming coatings with complicated shapes, circuits, barrier films, or other films have been being required.

In general, a target is produced from an ingot or billet prepared by melting/casting a metal, an alloy, or another material through hot forging, annealing (heat treatment), and processing of rolling and finishing (e.g., mechanical or polishing).

When sputtering thus produced target, further mechanical processing such as grinding or polishing to the target surface is performed on the target to smoothen and allow formation of a uniform film having stable characteristics with fewer occurrences of arcing and particles.

However, there was a problem in sputtering the target that the degree of vacuum in a vacuum chamber does not increase. And investigation for causes revealed that the hydrogen partial pressure in the vacuum chamber is high. After further investigation for causes, it was revealed that the surface of a target used occludes a large volume of hydrogen and that this hydrogen vaporizes during sputtering to increase the hydrogen partial pressure in the chamber.

In addition, in recent sputtering technology, a coil is disposed between a sputtering target and a substrate to increase the plasma density and allow flying sputtering particles to direct toward the substrate as much as possible. As a result, the sputtering rate is increased, and the uniformity of the film is improved. Thus, the quality of the film deposited on the substrate is comprehensively enhanced.

The material of the coil is usually the same as that of the target or a part of the material constituting a sputtered film deposited on a substrate, but is not particularly limited as long as the material of the coil does not contaminate the thin film on the substrate. The coil may have any shape, a circular or spiral shape, for example. A plurality of coils may be disposed in multiple stages.

The present inventors have struggled with a reduction in hydrogen content on the surface of a target and/or a coil, and have had a belief that hydrogen occlusion occurs in the process of producing the target and/or the coil, particularly, in cutting and polishing processing.

In conventional mechanical processing (cutting and polishing processing), since the processing efficiency is valued, a water-soluble oil such as emulsion, soluble oil, or solution is used having excellent coolability to perform processing at high speed. As long as based on this idea, a countermeasure against the problem of an unsatisfactory degree of vacuum could not be solved. That is, the volume of hydrogen could not be necessarily reduced in conventional mechanical processing of the surfaces of a target and a coil.

Thus, the present inventors have studied documents relating to the surface of a target and/or a coil or hydrogen present in a target and/or a coil. And, they have found the following documents.

Japanese Patent Laid-Open Publication No. H11-1766 A describes that a reduction in hydrogen content of a surface to 50 ppm or less can prevent generation of nodules and decrease the number of particles. In addition, a reduction in total volume of Si, Al, Co, Ni, and B to 500 ppm or less can prevent micro-arcing on the erosion surface and can prevent occurrence of nodules and decrease the number of particles. There are descriptions of examples using Ti, Ta, Cu, and Al as the materials. However, the problem is understood as only an issue of the composition of the target. Thus, it does not provide a fundamental solution for the problem that the degree of vacuum in a vacuum chamber is not enhanced. And there is a problem that how the volume of hydrogen is decreased during processing of a target is not technically disclosed or suggested.

Japanese Patent Laid-Open Publication No. H08-13141 A discloses that projections occur on the target surface by aluminum oxide and hydrogen to cause abnormal electrical discharge during sputtering and that the volumes of the oxide and the hydrogen gas are reduced to 3 ppm or less and 0.1 ppm or less, respectively. However, in this case also, the problem is understood as only an issue of the composition of a target. Thus, it does not provide a fundamental solution for the problem that the degree of vacuum in a vacuum chamber is not enhanced. And there is a problem that how the volume of hydrogen is decreased during processing of a target is not technically disclosed or suggested.

Japanese Patent Laid-Open Publication No. H11-080942 A discloses that hydrogen contained in a Ta sputtering target and a Ta film formed on a TaN film causes a tendency of peeling of the film and an increase in the number of particles and that the hydrogen concentration in the Ta is therefore decreased to 20 ppm or less. However, in this case also, the problem is understood as only an issue of the composition of a target. Thus, it does not provide a fundamental solution for the problem that the degree of vacuum in a vacuum chamber is not enhanced. And there is a problem that how the volume of hydrogen is decreased during processing of a target is not technically disclosed or suggested.

Japanese Patent Laid-Open Publication No. H06-322529 A discloses that the oxygen content is 150 ppm or less, that oxygen is generated during sputtering to disadvantageously affect the film characteristics such as a resistance value of the film to be formed, and that a decrease in the number of generated particles and a decrease in oxygen content conflict with each other. This does not directly relate to hydrogen, besides, in this case also, the problem is understood as only an issue of the composition of a target. Thus, it does not provide a fundamental solution for the problem that the degree of vacuum in a vacuum chamber is not enhanced. And there is a problem that how the volume of hydrogen is decreased during processing of a target is not technically disclosed or suggested.

Japanese Patent Laid-Open Publication No. 2003-226963 A discloses a sputtering target composed of Cr as a main component and 10 to 50% by atom of Al, Si, Ti, Zr, Hf, V, Nb, Ta, W, Mo, and B and discloses that a hard nitride film with high adhesion can be formed by regulating the total content of oxygen, carbon, sulfur, and hydrogen to 3000 ppm or less. This is not understood as only a problem of hydrogen, but understood as an issue of the composition of a target; thus, it does not provide a fundamental solution for the problem that the degree of vacuum in a vacuum chamber is not enhanced. And there is a problem that how the volume of hydrogen is decreased during processing of a target is not technically disclosed or suggested.

Japanese Patent Laid-Open Publication No. H03-257158 A discloses a sputtering target for a metal alloy with a high melting point, where the target includes W, Mo, Ti, or Ta as the material thereof. However, it does not provide a fundamental solution for the problem that the degree of vacuum in a vacuum chamber is not enhanced. And there is a problem that how the volume of hydrogen is decreased during processing of a target is not technically disclosed or suggested.

Japanese Patent Laid-Open Publication No. 2007-73128 A describes that the oxygen level of a sputtering target is decreased through scavenging by hydrogen during synthesis of a metallic structure. This case also does not provide a fundamental solution for the problem that the degree of vacuum in a vacuum chamber is not enhanced. And there is a problem that how the volume of hydrogen is decreased during processing of a target is not technically disclosed or suggested.

Japanese Patent Laid-Open Publication No. H01-290766 A discloses a Ti-containing high purity Ta sintered target and describes that hydrides of Ta and Ti are easily pulverized into a powder having a suitable particle size for the subsequent sintering, and dehydrogenation gives a surface-active powder to accelerate sintering and also prevents contamination by oxygen. However, this case also does not provide a fundamental solution for the problem that the degree of vacuum in a vacuum chamber is not enhanced. And there is a problem that how the volume of hydrogen is decreased during processing of a target is not technically disclosed or suggested.

Japanese Patent No. 4184344 B describes a surface treatment process by mechanically polishing the inner surface of a vacuum container in the presence of a hydrogen atom-free liquid medium. According to the descriptions, the main reasons that this surface treatment process is required are as follows: one is in order to decrease the degree of vacuum achieved since hydrogen is diffused and desorbed from the surface of a vacuum member and the inner surface, and is gradually released in the vacuum system. The other is that it is necessary to reduce the volume of hydrogen and moisture adsorbed, occluded, or solid-solubilized in the vacuum container and the device, since a sufficient acceleration cannot be achieved if hydrogen is occluded or solid-solubilized in the member in a device such as an accelerating cavity.

The inner walls of these vacuum devices and equipment installed inside thereof are generally not worn over a long period of time. Therefore, once hydrogen and moisture that are adsorbed, occluded, or solid-solubilized are removed by mechanical polishing, hydrogen and moisture will not be newly adsorbed, occluded, or solid-solubilized; as long as the devices are not disposed under specific environment.

However, since the sputtering target is an expendable component and the target itself is worn with lapse of time due to erosion, that is, a new erosion surface appears, an idea that the target itself directly affects the degree of vacuum during sputtering does not occur. It is believed by common sense that hydrogen is constantly released from the start and with the progress of erosion of the target.

In that sense, when inclusion of hydrogen or moisture is a problem, it is necessary to reduce the volume of hydrogen or moisture of the entire target (the entire area to be eroded), and the idea that merely mechanical polishing of the surface can solve the problem is not conceivable. From this viewpoint, Japanese Patent No. 4184344 B describes a solution that prevents adsorption, occlusion, and solid-solution of hydrogen and moisture during polishing of the inside of a vacuum container and equipment in an initial stage. Since the device and equipment are used for a relatively long time after the conduction of the process, it is hardly conceivable that the process is applicable to a sputtering target which is frequently replaced. Thus, this document does not disclose or suggest the present invention.

Japanese Patent Laid-Open Publication No. H11-19853 A discloses a method of polishing the surface of a hydrogen-occluding metal using a grinding fluid having a moisture content controlled to a predetermined level or less. It is described that according to this method of grinding a hydrogen-occluding metal, the hydrogen volume in the hydrogen-occluding metal of which surface is ground is extremely small to show a sufficient effect on the original use of the hydrogen-occluding metal.

In general, the hydrogen-occluding metal stores hydrogen or heat through a reaction of generating a hydride and has excellent functions of occluding hydrogen by taking hydrogen into gaps between metal atoms and of releasing the taken hydrogen.

Japanese Patent Laid-Open Publication No. H11-19853 A describes that hydrogen derived from moisture is prevented from being absorbed in the hydrogen-occluding metal. This is the effect that the use of a grinding fluid containing less moisture in volume can prevent an active surface newly generated by polishing the surface of a hydrogen-occluding metal from repeated exposure directly to moisture in the grinding fluid and the atmosphere. However, this is merely preventing the function of the hydrogen-occluding metal temporarily.

Since the sputtering target is an expendable component and the target itself is worn with lapse of time due to erosion, that is, a new erosion surface appears, an idea that the target itself directly affects the degree of vacuum during sputtering does not occur. It is believed by common sense that hydrogen is constantly released from the start and with the progress of erosion of the target.

In this sense, when inclusion of hydrogen or moisture is a problem, it is necessary to reduce the volume of hydrogen or moisture of the entire target (the entire area to be eroded), and the idea that merely mechanical polishing of the surface can solve the problem is not conceivable. From this viewpoint, Japanese Patent Laid-Open Publication No. H11-19853 A describes a solution that prevents adsorption, occlusion, and solid-solution of hydrogen and moisture during polishing. However, the sputtering target, which thereafter is used for a long time with repetition of occlusion and release of hydrogen, it is hardly conceivable that the process is applicable to a sputtering target which is frequently replaced. Thus, the document does not disclose or suggest the present invention.

Furthermore, Japanese Patent Laid-Open Publication No. 2001-214264 A discloses a technology using high purity copper as a coil for sputtering deposition. In this case, the purpose is removal of defects in a film deposited on a substrate.

SUMMARY

It was revealed that the decrease in degree of vacuum during sputtering is attributed to the hydrogen content of the surface of the target and/or the coil disposed at the periphery of a plasma-generating region for confining plasma (hereinafter, abbreviated to "coil") and that the increase of hydrogen is attributed to adsorption or occlusion of hydrogen in the process of producing the target and/or the coil.

For the need of reducing the volume of the adsorbed or occluded hydrogen, it has been found that heating of the surface of the target and/or the coil before being installed in a sputtering apparatus (vacuum chamber) is effective. Thus, provided is a sputtering target and/or a coil that reduces adsorption or occlusion of hydrogen to the target surface, enhances the degree of vacuum during sputtering, has a uniform and fine structure, gives stable plasma, and allows production of a film having excellent uniformity, and also provided is a method of producing the target and/or the coil.

Either after sputtering or at replacing the target, it is effective and necessary to heat the surface of a target and/or a coil. It is required to regulate the hydrogen content on the surface of a target and/or a coil in order to improve downtime of the sputtering devices, since a correlation is found between the hydrogen content on the surface of a target and/or a coil and the recovery time of vacuum in a chamber.

In order to solve the above-described problems, the present invention is based on the findings that heating of a sputtering target and/or a coil disposed at the periphery of a plasma-generating region for confining plasma under a vacuum atmosphere or an inert gas atmosphere is effective.

Based on these findings, the present invention provides a sputtering target and/or a coil disposed at the periphery of a plasma-generating region for confining plasma, the target and/or the coil having a surface to be eroded with a hydrogen content of 500 $\mu L/cm^2$ or less, 300 $\mu L/cm^2$ or less, or 100 $\mu L/cm^2$ or less. The sputtering target and/or the coil may be composed of at least one or more elements selected from the group consisting of Cu, Ti, Ta, Al, Ni, Co, W, Si, Pt, and Mn and inevitable impurities.

The present invention also provides a method of producing a sputtering target and/or a coil, wherein by heating a sputtering target and/or a coil disposed at the periphery of a plasma-generating region for confining plasma under a vacuum atmosphere or an inert gas atmosphere, the hydrogen content of a surface to be eroded of the target and/or the coil is regulated to 500 $\mu L/cm^2$ or less, 300 $\mu L/cm^2$ or less, or 100 $\mu L/cm^2$ or less. The method of producing a sputtering target and/or a coil may be for a sputtering target and/or coil composed of at least one or more elements selected from the group consisting of Cu, Ti, Ta, Al, Ni, Co, W, Si, Pt, and Mn and inevitable impurities.

In the present invention, heating of a target and/or a coil is effective in the process of producing the target and/or the coil, in particular, before installation in a sputtering apparatus (vacuum chamber). This can provide the sputtering target and/or coil which have effects of reducing adsorption or occlusion of hydrogen to the surface of the target, increasing the degree of vacuum during sputtering, providing uniform and fine structures, giving stable plasma, and allowing production of a film having excellent uniformity.

BRIEF DESCRIPTION OF THE DRAWING

FIG. 1 shows a positional relation among a target, a substrate (wafer), and coils disposed in a sputtering apparatus (vacuum chamber).

DETAILED DESCRIPTION

In the present invention, before a sputtering target and/or a coil is installed in a sputtering apparatus (vacuum chamber), the surface thereof is heated under a vacuum atmosphere or an inert gas atmosphere. The heating may be performed by any method, but use of hydrogen gas causing hydrogen occlusion must be avoided. In general, erosion mainly occurs in the sputtering target, but the coil is also eroded. Hence, in the case of using a coil for confining plasma, the coil is also required to be dehydrogenated.

It is desirable to install the sputtering target and/or the coil which is dehydrogenated by heating in a sputtering apparatus (vacuum chamber) as promptly as possible; desirably just before installation. This is because the possibility of adsorption or occlusion of hydrogen during the time before the installation becomes high. Specifically, the desirable time to install the sputtering target is within 5 hours, more desirably within 3 hours, and the most desirably, within 1 hour.

In the case when there is not plenty of time (or when it will take time) to install the dehydrogenated sputtering target and/or the coil in a sputtering apparatus for vacuum suction, it can be stored in a hermetically sealed state (vacuum sealed) before the installation. Though storing time depends on the level of hermetic seal, it is generally possible to store the target and/or coil for approximately 100 hours; storing for approximately 12 months is even possible in higher degree of hermetic seal.

With conventional technology, it can be said that such heating for dehydrogenation of a sputtering target and/or a coil has not been performed before installation in a sputtering apparatus (vacuum chamber).

Any method can be used for heating a sputtering target and/or a coil, but a method is preferred that can heat only the surface rather than the entire target and/or coil. Examples of the method of heating only surfaces include lasers, infrared rays, and lamps; they can avoid deformation of the sputtering target or the coil, in addition, the use of an aluminum material can prevent melting of a member.

As a result, it is possible to produce a sputtering target and/or a coil having a surface to be eroded having a hydrogen content reduced to 500 $\mu L/cm^2$ or less to be introduced in a sputtering apparatus (vacuum chamber). This can prevent an increase in hydrogen partial pressure in the vacuum chamber after sputtering to provide a high degree of vacuum.

The sputtering target and/or the coil is an expendable component, and the target and/or coil itself is worn with lapse of time due to erosion, that is, a new erosion surface appears. Thus, by common sense, it is believed that hydrogen is constantly released from the start and with the progress of the erosion of the target and/or the coil. Consequently, an idea that the target and/or coil itself directly affects the degree of vacuum during sputtering does not occur.

When inclusion of hydrogen or moisture is a problem, it is necessary to reduce the volume of hydrogen or moisture of the entire target and/or coil (the entire area to be eroded), and it cannot be understood that merely mechanical polishing of the surface can solve the problem.

While searching for causes of adsorption/occlusion of hydrogen or moisture to the sputtering target and/or the coil, it was revealed that the adsorption/occlusion is not an issue of the inside of the target and/or the coil but an issue related to during mechanical processing of the surface thereof. Thus, it is possible to remove adsorbed/occluded hydrogen and moisture in an initial stage of producing a sputtering target and/or a coil, i.e., in the mechanical processing in producing thereof. This effectively prevents an increase in hydrogen partial pressure in the vacuum chamber.

Further regulation of the hydrogen content to 300 μL/cm² or less can more effectively prevent the increase in hydrogen partial pressure. Much further regulation of the hydrogen content to 100 μL/cm² or less can more effectively prevent the increase in hydrogen partial pressure.

In addition, release of hydrogen gas during sputtering affects plasma to cause a reduction of the sputtering rate and causes an increase in variation (variation increases from 5% to 15% approximately).

A hydrogen content of the sputtering target and/or the coil regulated to 500 μL/cm² or less, further to 300 μL/cm² or less, or further to 100 μL/cm² or less has an effect of preventing an increase in hydrogen partial pressure; in addition, can improve the uniformity of a film through a reduction in hydrogen in the film. Also, the reduction in the hydrogen content of the film can improve the resistance to electro-migration.

At least one or more elements selected from the group consisting of Cu, Ti, Ta, Al, Ni, Co, W, Si, Pt, and Mn, which readily occlude hydrogen, can be effectively applied to the sputtering target and/or the coil of the present invention. The typical example is a tantalum (Ta) and a titanium (Ti) sputtering target and/or coil, which require elaborative finishing processing much more and are likely to have chances of occluding hydrogen. These metal materials are most preferred in the present invention. However, it is not limited to a tantalum (Ta) and a titanium (Ti) sputtering target and/or coil as a matter of course.

The sputtering target and/or the coil of the present invention is usually produced by the following processes. As an example, tantalum is used as mentioned above. For example, tantalum having a high purity of 4N (99.99% or more) is used as a raw material of a target and/or a coil, is subjected to melting/purification by, for example, electron beam melting for increasing the purity thereof, and is produced into an ingot or billet by casting. The method is not limited to the electron beam melting, and any melting method can be employed. For obtaining higher purity, however, the electron beam melting is an appropriate melting method and can provide a material having a purity of 6N or more.

Subsequently, the ingot or billet is subjected to a series of processing such as annealing-forging, rolling, annealing (heat treatment), and finishing. The forging or rolling destroys the cast structure and can diffuse or eliminate pores and segregation, and subsequent annealing causes recrystallization. Repetition of cold forging or cold rolling and recrystallization annealing allows densification, refinement, and enhancement of strength of the structure. In this case, the target and/or the coil can also be produced directly from a cast (ingot or billet). Subsequently, the target and/or the coil is formed into a final shape by finishing processing such as mechanical processing or polishing processing.

In a rod-shaped material (including a linear material) as a raw material of a coil, the ingot or billet is drawn or extruded into a rod, and the rod is optionally wire drawn. The resulting rod-shaped material (including the linear material) is used as a raw material of a coil. In a production of a coil, the coil can be produced by continuously bending the rod-shaped coil material into a spiral, but may be produced by finally welding some coil fragments having similar shapes.

In general, a tantalum target and/or coil is produced by the above-described production process, but the production process is merely an example. The present invention is characterized by selecting conditions for heating the sputtering target and/or the coil, and the production process such as melting/casting, forging, and heat treatment is not intended to be an invention. The target and/or the coil may be produced by any other processes, and the present invention encompasses all of them.

The present invention also relates to an invention of reducing the volume of hydrogen that is generated in erosion of the target and/or the coil and can be similarly applied to a sputtering apparatus including a target to be eroded and/or a coil to be eroded as well as to a vacuum device having such a component.

EXAMPLES

Examples are now explained. Note that these examples merely show an example of the present invention and that the present invention is not limited to these examples. That is, the present invention encompasses other modes and modifications within the technical scope of the present invention.

In the following examples, Ta is used as a typical example, but at least one or more elements selected from the group consisting of Cu, Ti, Ta, Al, Ni, Co, W, Si, Pt, and Mn can be used in a similar process and can effectively prevent hydrogen occlusion.

Details of mechanical processing and evaluation results in Examples and Comparative Examples are described below.

In Examples and Comparative Examples, the volume of hydrogen gas has to be measured as follows. A sample of 20×10×8 mm was cut out by a dry process from each specimen containing hydrogen. This sample was heated to 800° C., and the hydrogen gas released from the surface of the sample was introduced to a mass spectrometer and was quantitatively measured.

As the mass spectrometer, a temperature programmed desorption-mass spectrometer (AGS-7000, manufactured by Anelva Corp.) was used. A sample was set to a silica tube for vacuum heating. After preliminary exhaustion with a rotary pump for 5 minutes, adsorbed moisture was removed by exhaustion under a high degree of vacuum for 10 minutes. Then, after confirmation of a decrease in ion intensity of the background, the sample was heated from room temperature to 800° C. at an increasing temperature rate of 20° C./min and was then kept at 800° C. for 5 minutes. Subsequently, the sample was allowed to cool for 5 minutes, and the volume of gas generated during the cooling was measured. Quantitative measurement was performed by injecting a predetermined volume of hydrogen.

Example 1

A tantalum raw material having a purity of 99.997% was molten by an electron beam and was cast into an ingot or billet having a thickness of 200 mm and a diameter of 200 mm. Subsequently, this ingot or billet was drawn at room temperature and then was subjected to recrystallization annealing at 1500K to obtain a material having a thickness of 100 mm and a diameter of 100 mm.

The resulting material was subjected to cold drawing, upset forging, and recrystallization annealing at 1173K. Subsequently, a cold rolling was performed again and a process of annealing at 1173K (900° C.) was repeated twice. After finishing processing, a target material having a thickness of 10 mm and a diameter of 320 mm was obtained.

The target prepared as above was adjusted the surface roughness by finishing processing, and dehydrogenation thereof was performed in the following conditions:

Surface roughness of the target: 0.2 μm

Heating conditions of the target: vacuum atmosphere, a temperature of 900° C., and for 2 hours.

The sputtering target dehydrogenated by heating was installed in a sputtering apparatus (vacuum chamber) within 2 hours.

As a result, the hydrogen gas volume in Example 1 was 6 μL/cm$^2$. The degree of vacuum before sputtering was $1\times10^{-7}$ Pa, and the results were good.

Example 2

A target material prepared in the same conditions as those in Example 1 was adjusted the surface roughness by finishing processing, and dehydrogenation thereof was performed in the following conditions:

Surface roughness of the target: 0.2 μm

Heating conditions of the target: vacuum atmosphere, a temperature of 700° C., for 2 hours.

The sputtering target dehydrogenated by heating was installed in a sputtering apparatus (vacuum chamber) within 1 hour. As a result, the hydrogen gas volume in Example 2 was 100 μL/cm$^2$. The degree of vacuum before sputtering was $1\times10^{-7}$ Pa, and the results were good.

Example 3

A target material prepared in the same conditions as those in Example 1 was adjusted the surface roughness by finishing processing, and dehydrogenation thereof was performed in the following conditions:

Surface roughness of the target: 0.2 μm

Heating conditions of the target: argon gas atmosphere, a temperature of 700° C., for 2 hours.

The sputtering target dehydrogenated by heating was installed in a sputtering apparatus (vacuum chamber) within 2 hours. As a result, the hydrogen gas volume in Example 3 was 300 μL/cm$^2$. The degree of vacuum before sputtering was $2\times10^{31\ 7}$ Pa, and the results were good.

Example 4

A target material prepared in the same conditions as those in Example 1 was adjusted the surface roughness by finishing processing, and dehydrogenation thereof was performed in the following conditions:

Surface roughness of the target: 0.2 μm

Heating conditions of the target: vacuum atmosphere, a temperature of 500° C., for 2 hours.

The sputtering target dehydrogenated by heating was installed in a sputtering apparatus (vacuum chamber) within 1 hour. As a result, the hydrogen gas volume in Example 4 was 350 μL/cm$^2$. The degree of vacuum before sputtering was $5\times10^{-7}$ Pa, and the results were good.

Comparative Example 2

A target material prepared in the same conditions as those in Example 1 was adjusted the surface roughness by finishing processing, and dehydrogenation thereof was performed in the following conditions:

Surface roughness of the target: 0.2 μm

Heating conditions of the target: the atmosphere, a temperature of 700° C., for 2 hours.

The sputtering target was installed in a sputtering apparatus (vacuum chamber) within 1 hour. As a result, the hydrogen gas volume in Comparative Example 2 was 800 μL/cm$^2$. The degree of vacuum before sputtering was $5\times10^{-6}$ Pa, and the results were bad. This is believed to be because dehydrogenation was unsatisfactory due to heating under the atmosphere.

Comparative Example 3

A target material prepared under the same conditions as those in Example 1 was adjusted the surface roughness by finishing processing. The sputtering target was installed in a sputtering apparatus (vacuum chamber) within 1 hour. As a result, the hydrogen gas volume in Comparative Example 3 was 1000 μL/cm$^2$. The degree of vacuum before sputtering was $1\times10^{-6}$ Pa, and the results were bad. This is believed to be because hydrogen that entered during processing remained since dehydrogenation by heating was not performed.

Example 5

An ingot of titanium with a high purity was hot-worked at 700° C. After warm working at 275° C. with a working ratio of 2.0, uniform heat treatment over the entire target was conducted at 600° C. for 1 hour to obtain a target material having a thickness of 10 mm and a diameter of 320 mm.

Details of mechanical processing and evaluation results in Examples and Comparative Examples will be described below.

A target prepared as in the above was adjusted the surface roughness by finishing processing, and dehydrogenation thereto was performed in the following conditions:

Surface roughness of the target: 0.2 μm

Heating conditions of the target: vacuum atmosphere, a temperature of 900° C., for 2 hours.

The dehydrogenated sputtering target was firstly hermetically sealed (vacuum sealed) and stored for a month. After removed the seal, the target was installed in a sputtering apparatus (vacuum chamber) within 1 hour. As a result, the hydrogen gas volume in Example 5 was 10 μL/cm$^2$. The degree of vacuum before sputtering was $1\times10^{-7}$ Pa, and the results were good.

Example 6

A target material prepared in the same conditions as those in Example 5 was adjusted the surface roughness by finishing processing, and dehydrogenation thereof was performed in the following conditions:

Surface roughness of the target: 0.2 μm

Heating conditions of the target: vacuum atmosphere, a temperature of 700° C., for 2 hours.

The dehydrogenated sputtering target was firstly hermetically sealed (vacuum sealed) and stored for a month. After removed the seal, the target was installed in a sputtering apparatus (vacuum chamber) within 1 hour. As a result, the hydrogen gas volume in Example 6 was 130 μL/cm$^2$. The degree of vacuum before sputtering was $1\times10^{-7}$ Pa, and the results were good.

Example 7

A target material prepared in the same conditions as those in Example 5 was adjusted the surface roughness by finishing processing, and dehydrogenation thereof was performed in the following conditions:

Surface roughness of the target: 0.2 μm

Heating conditions of the target: argon gas atmosphere, a temperature of 700° C., for 2 hours.

The dehydrogenated sputtering target was firstly hermetically sealed (vacuum sealed) and stored for a month. After removed the seal, the target was installed in a sputtering apparatus (vacuum chamber) within 1 hour. As a result, the hydrogen gas volume in Example 7 was 300 μL/cm$^2$. The degree of vacuum before sputtering was $2\times10^{-7}$ Pa, and the results were good.

Example 8

A target material prepared in the same conditions as those in Example 5 was adjusted the surface roughness by finishing processing, and dehydrogenation thereof was performed in the following conditions:

Surface roughness of the target: 0.2 μm

Heating conditions of the target: vacuum atmosphere, a temperature of 500° C., for 2 hours.

The dehydrogenated sputtering target was firstly hermetically sealed (vacuum sealed) and stored for a month. After removed the seal, the target was installed in a sputtering apparatus (vacuum chamber) within 1 hour. As a result, the hydrogen gas volume in Example 8 was 400 μL/cm$^2$. The degree of vacuum before sputtering was $6\times10^{-7}$ Pa, and the results were good.

Ta targets which were prepared in Examples 1 to 4, were dehydrogenated, hermetically sealed (vacuum sealed) and stored in the same way as described. In lapse of one month, after removed the seal, the target was installed in a sputtering apparatus (vacuum chamber) within 1 hour. As a result, it was revealed that there was no increase in the hydrogen gas volume and no decrease in the degree of vacuum before sputtering. Thus, results shown with Ta target were good as those with Ti target.

Comparative Example 4

A target material prepared in the same conditions as those in Example 5 was adjusted the surface roughness by finishing processing, and dehydrogenation thereof was performed in the following conditions:

Surface roughness of the target: 0.2 μm

Heating conditions of the target: vacuum atmosphere, a temperature of 500° C., for 2 hours.

The sputtering target was installed in a sputtering apparatus (vacuum chamber) within 1 hour. As a result, the hydrogen gas volume in Comparative Example 4 was 550 μL/cm$^2$. The degree of vacuum before sputtering was $1\times10^{-6}$ Pa, and the results were bad. This is believed to be because dehydrogenation was unsatisfactory due to heating at a low temperature.

Comparative Example 5

A target material prepared in the same conditions as those in Example 5 was adjusted the surface roughness by finishing processing, and dehydrogenation thereof was performed in the following conditions:

Surface roughness of the target: 0.2 μm, and

Heating conditions of the target: the atmosphere, a temperature of 700° C., for 2 hours.

The sputtering target was installed in a sputtering apparatus (vacuum chamber) within 1 hour. As a result, the hydrogen gas volume in Comparative Example 5 was 950 μL/cm$^2$. The degree of vacuum before sputtering was $5\times10^{-6}$ Pa, and the results were bad. This is believed to be because dehydrogenation was unsatisfactory due to heating under the atmosphere.

Comparative Example 6

A target material prepared in the same conditions as those in Example 5 was adjusted the surface roughness by finishing processing. The sputtering target was installed in a sputtering apparatus (vacuum chamber) within 1 hour. As a result, the hydrogen gas volume in Comparative Example 6 was 1200 μL/cm$^2$. The degree of vacuum before sputtering was $1\times10^{-5}$ Pa, and the results were bad. This is believed to be because hydrogen that entered during processing remained since dehydrogenation by heating was not performed.

Evaluation of Examples and Comparative Examples

In the above Examples and Comparative Examples, examples of tantalum (Ta) and titanium (Ti) were described. Besides, it is confirmed that similar results were obtained with elements of Cu, Al, Ni, Co, W, Si, Pt, and Mn. With these elements, the type of processing and heat treatment conditions in the process of producing targets varied depending on the type of the element, however, if the produced targets had surface roughness adjusted by finishing processing and were further dehydrogenated so as to satisfy the conditions of the present invention, which yielded good results: the hydrogen gas volume was sufficiently reduced to 300 μL/cm$^2$ or less and the degree of vacuum before sputtering was $1\times10^{-7}$ Pa or less. In contrast, those departing from the conditions of the present invention yielded poor results: a hydrogen gas volume increased, and they could not achieve a degree of vacuum before sputtering of $1\times10^{-7}$ Pa.

With the coil disposed at the periphery of a plasma-generating region for confining plasma, it is confirmed that the same results are obtained by taking the same process with the target in Examples and Comparative Examples that have been explained.

The present invention can reduce hydrogen occlusion of the target surface by appropriately regulating the process of producing a target and/or a coil, in particular, the conditions for heating the surfaces of the target and/or the coil, and thereby exhibits excellent effects that the volume of hydrogen gas released from the target and/or the coil when the target and/or the coil is used for sputtering can be reduced to prevent the degree of vacuum in the vacuum chamber from degrading in wafer replacement and that throughput during sputtering, i.e., the number of substrates treated per time or per sputtering, can be increased.

The present invention has an effect of providing a target and/or a coil that has uniform and fine structures, makes plasma stable during sputtering, and can foam a film with excellent uniformity. The target and/or the coil is useful in the electronics field, in particular, as a target and/or a coil that is suitable for foaming, for example, a coating with a complicated shape, a circuit, or a barrier film.

We claim:

1. A method of providing a sputtering target and/or a coil, comprising the steps of:

heating a finished-processed sputtering target and/or a coil for being disposed at a periphery of a plasma-generating region for confining plasma to 500° C. or more under a vacuum atmosphere or an inert gas atmosphere to regulate the hydrogen content of a surface to be eroded of the target and/or the coil to a depth of 8 mm beneath the surface to 500 μL/cm² or less; and installing the target and/or coil in a vacuum chamber within 5 hours after said heating step to prevent adsorption or occlusion of hydrogen; and determining the hydrogen content by cutting out a sample of 20×10×8 mm=1.6 cm³ of the target or the coil including the surface, heating the sample to 800° C., and quantitatively measuring hydrogen gas released from the surface of the sample by means of mass spectrometry.

2. The method according to claim 1, wherein the hydrogen content of the surface to be eroded of the sputtering target and/or the coil to a depth of 8 mm beneath the surface is regulated to 300 μL/cm² or less.

3. The method according to claim 1, wherein the hydrogen content of the surface to be eroded of the sputtering target and/or the coil to a depth of 8 mm beneath the surface is regulated to 100 μL/cm² or less.

4. The method according to claim 3, wherein the sputtering target and/or the coil is made of at least one or more elements selected from the group consisting of Cu, Ti, Ta, Al, Ni, Co, W, Si, Pt, and Mn.

5. The method according to claim 1, wherein the sputtering target and/or the coil is made of at least one element selected from the group consisting of Cu, Ti, Ta, Al, Ni, Co, W, Si, Pt, and Mn.

* * * * *